US012313393B2

(12) United States Patent
Jang et al.

(10) Patent No.: US 12,313,393 B2
(45) Date of Patent: May 27, 2025

(54) LEVEL SENSOR AND SUBSTRATE PROCESSING APPARATUS INCLUDING THE SAME

(71) Applicant: Samsung Electronics Co., Ltd., Suwon-si (KR)

(72) Inventors: Sungho Jang, Suwon-si (KR); Sangwoo Bae, Suwon-si (KR); Minhwan Seo, Suwon-si (KR); Jangwoon Sung, Suwon-si (KR); Akinori Okubo, Suwon-si (KR); Seungwoo Lee, Suwon-si (KR); Jungchul Lee, Suwon-si (KR); Jaehwang Jung, Suwon-si (KR); Sangjoon Hong, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 155 days.

(21) Appl. No.: 18/215,437

(22) Filed: Jun. 28, 2023

(65) Prior Publication Data

US 2024/0118072 A1    Apr. 11, 2024

(30) Foreign Application Priority Data

Oct. 11, 2022   (KR) ......................... 10-2022-0129791

(51) Int. Cl.
*G01B 11/06*     (2006.01)
*G01B 9/02*      (2022.01)

(52) U.S. Cl.
CPC ...... *G01B 11/0608* (2013.01); *G01B 9/02041* (2013.01); *G01B 2290/70* (2013.01)

(58) Field of Classification Search
CPC ............ G01B 11/0608; G01B 9/02041; G01B 2290/70; G01B 9/0201; G01B 11/02;
(Continued)

(56) References Cited

U.S. PATENT DOCUMENTS 7,952,726 B2 * 5/2011 Kato ...................... G03F 7/706
356/521
10,274,370 B2   4/2019 Boef
(Continued)

FOREIGN PATENT DOCUMENTS

EP      1037117 A2    9/2000
EP      2228685 A2    9/2010
(Continued)

OTHER PUBLICATIONS

Amine Lakcher et al, "On-product focus monitoring and control for immersion lithography in 3D-NAND manufacturing," Proc. SPIE 11325, Metrology, Inspection, and Process Control for Microlithography XXXIV, 1132521 (Mar. 20, 2020).

*Primary Examiner* — Jonathan M Hansen
(74) *Attorney, Agent, or Firm* — Muir Patent Law, PLLC

(57) ABSTRACT

Provided are a level sensor configured to detect a height level of a substrate, and a substrate processing apparatus including the level sensor. The level sensor includes a measurement light source configured to radiate measurement light toward the substrate, a prism configured to split reflected light of the measurement light into first polarized light and second polarized light and generate a first optical path length difference between the first polarized light and the second polarized light, an optical path length modulator configured to keep constant an optical path length of the first polarized light and periodically change an optical path length of the second polarized light, and a detector configured to detect the first optical path length difference based on an interference signal between the first polarized light and the second polarized light.

20 Claims, 14 Drawing Sheets

(58) Field of Classification Search
CPC ....... G03F 9/7034; G03F 7/7085; G02B 5/04; G02B 27/0916; G02B 27/283; G02B 27/30

See application file for complete search history.

(56) References Cited

U.S. PATENT DOCUMENTS

| | | |
|---|---|---|
| 10,704,888 B2 | 7/2020 | Ishigaki et al. |
| 10,782,120 B2 | 9/2020 | Safrani |
| 11,885,608 B2 * | 1/2024 | Hidaka ................ G02B 5/3025 |
| 2002/0012122 A1 * | 1/2002 | Boyd .................... G01N 21/211 356/369 |
| 2006/0023225 A1 | 2/2006 | Tobben et al. |
| 2007/0268490 A1 * | 11/2007 | Kawakami ................ G01J 4/04 359/489.06 |
| 2022/0074848 A1 * | 3/2022 | Jung ................ G01N 21/9501 |
| 2023/0204493 A1 * | 6/2023 | Jung .................... G01N 21/211 356/364 |

FOREIGN PATENT DOCUMENTS

| | | | |
|---|---|---|---|
| JP | 2006269669 A | 10/2006 |
| JP | 2012104586 A | 5/2012 |
| JP | 6994881 B2 | 2/2022 |

* cited by examiner

LEVEL SENSOR AND SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2022-0129791, filed on Oct. 11, 2022, in the Korean Intellectual Property Office, the disclosure of which is incorporated by reference herein in its entirety.

BACKGROUND

The inventive concept relates to a level sensor and a substrate processing apparatus including the level sensor.

Level sensors are devices for detecting surface heights of measurement objects. Optical sensing-type level sensors, which detect surface heights of measurement objects in a non-contact manner, are widely used. Such level sensors are used in equipment (for example, exposure equipment) for processing substrates such as wafers, to detect surface heights of the substrates.

SUMMARY

The inventive concept provides a level sensor and a substrate processing apparatus including the level sensor.

According to an aspect of the inventive concept, there is provided a level sensor configured to detect a height level of a substrate, the level sensor including a measurement light source configured to radiate measurement light toward the substrate, a prism configured to split reflected light of the measurement light, which is reflected by the substrate, into first polarized light and second polarized light and generate a first optical path length difference between the first polarized light and the second polarized light, an optical path length modulator configured to keep constant an optical path length of the first polarized light and periodically change an optical path length of the second polarized light, and a detector configured to receive the first polarized light and the second polarized light, which are output from the optical path length modulator, and detect the first optical path length difference based on an interference signal generated by interference between the first polarized light and the second polarized light.

According to another aspect of the inventive concept, there is provided a level sensor configured to detect a height level of a substrate, the level sensor including a measurement light source configured to radiate measurement light toward the substrate, a slit plate configured to be arranged between the measurement light source and the substrate and including at least one slit, a Nomarski prism configured to split reflected light of the measurement light, which is reflected by the substrate, into first polarized light and second polarized light and generate a first optical path length difference between the first polarized light and the second polarized light, a photo-elastic modulator configured to keep constant an optical path length of the first polarized light and periodically change an optical path length of the second polarized light, a detector configured to receive the first polarized light and the second polarized light, which are output from the photo-elastic modulator, and detect the first optical path length difference based on an interference signal generated by interference between the first polarized light and the second polarized light, a first polarizing plate configured to be arranged between the substrate and the Nomarski prism to have a first polarizing axis and configured to polarize the reflected light, and a second polarizing plate arranged between the photo-elastic modulator and the detector and configured to polarize the first polarized light and the second polarized light.

According to yet another aspect of the inventive concept, there is provided a level sensor configured to detect a height level of a substrate, the level sensor including a measurement light source configured to radiate measurement light toward the substrate, a slit plate arranged between the measurement light source and the substrate and including at least one slit, a prism configured to split reflected light of the measurement light, which is reflected by the substrate, into first polarized light and second polarized light and generate a first optical path length difference between the first polarized light and the second polarized light, wherein the first optical path length difference generated by the prism is determined by an incidence height of the reflected light on an incidence surface of the prism, an optical path length modulator configured to keep constant an optical path length of the first polarized light and periodically change an optical path length of the second polarized light, and a detector configured to receive the first polarized light and the second polarized light, which are output from the optical path length modulator, and detect the first optical path length difference based on an interference signal generated by interference between the first polarized light and second polarized light, wherein the detector is further configured to detect a peak point of a strength of the interference signal and detect the first optical path length difference, based on the detected peak point.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
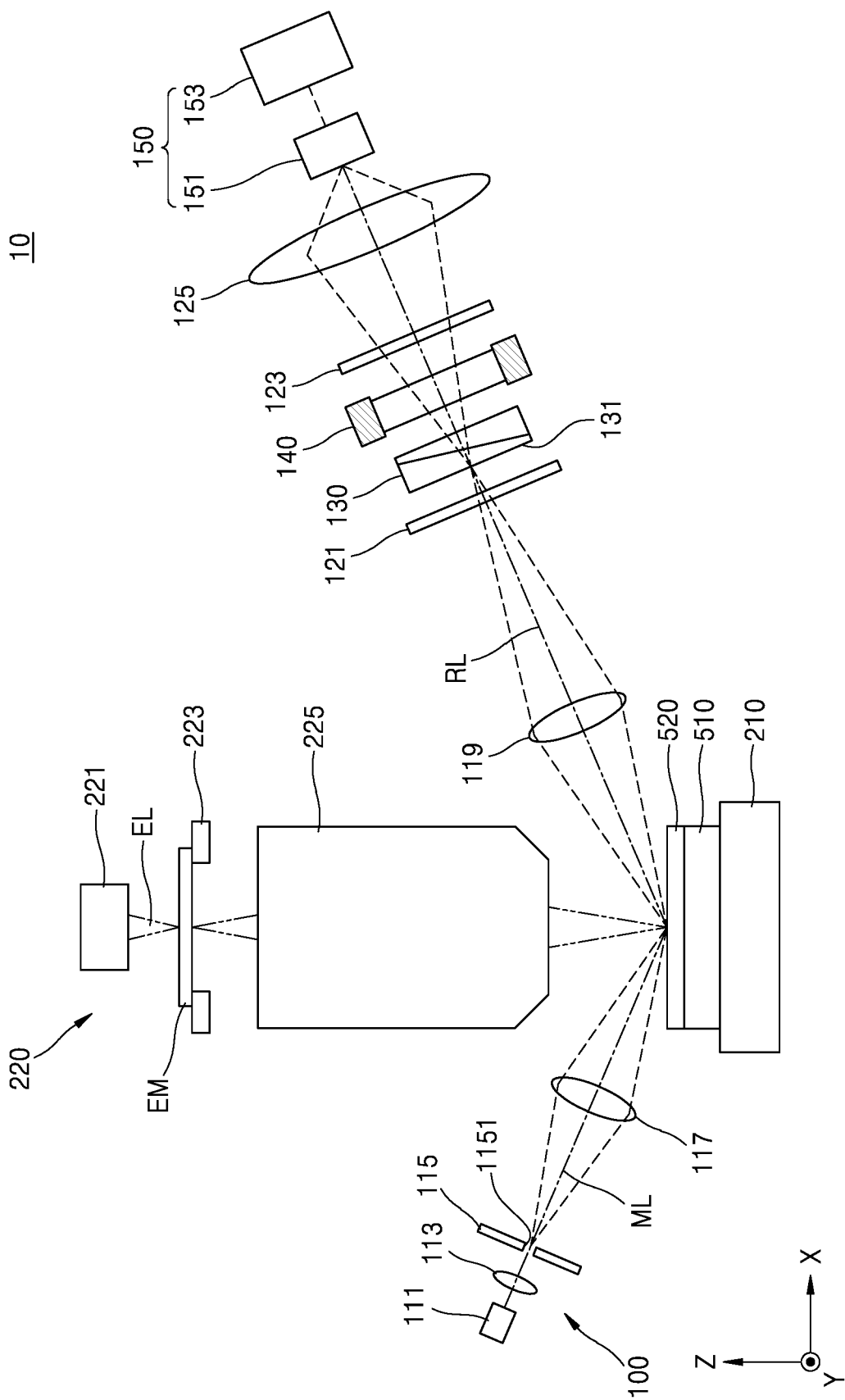
FIG. 1 is a configuration diagram illustrating a substrate processing apparatus according to some embodiments.

Hereinafter, embodiments of the inventive concept will be described in detail with reference to the accompanying drawings. Like components are denoted by like reference numerals throughout the specification, and repeated descriptions thereof are omitted.

Figure 2:
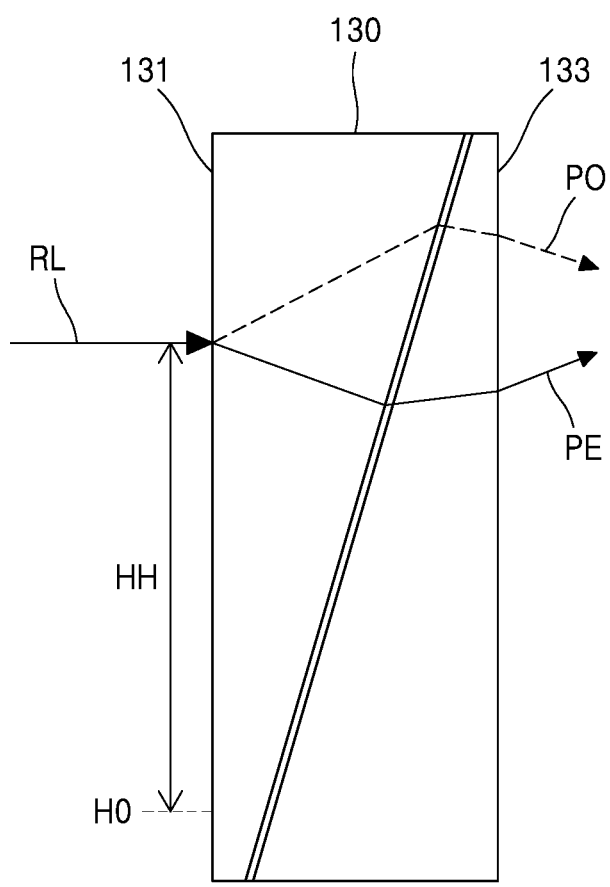
FIG. 2 is a configuration diagram schematically illustrating a prism of a level sensor in a substrate processing apparatus.
Figure 3:
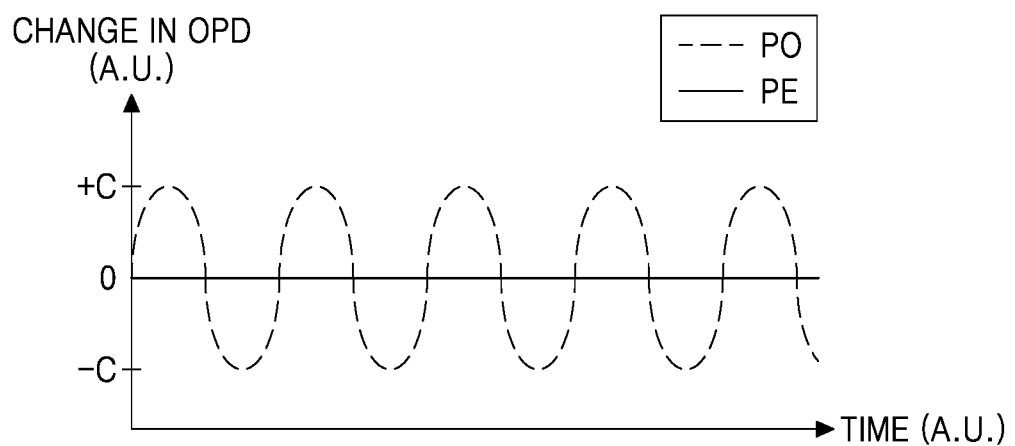
FIG. 3 is a graph illustrating a change in an optical path length of light in an optical path length modulator of a level sensor in a substrate processing apparatus.
Figure 4:
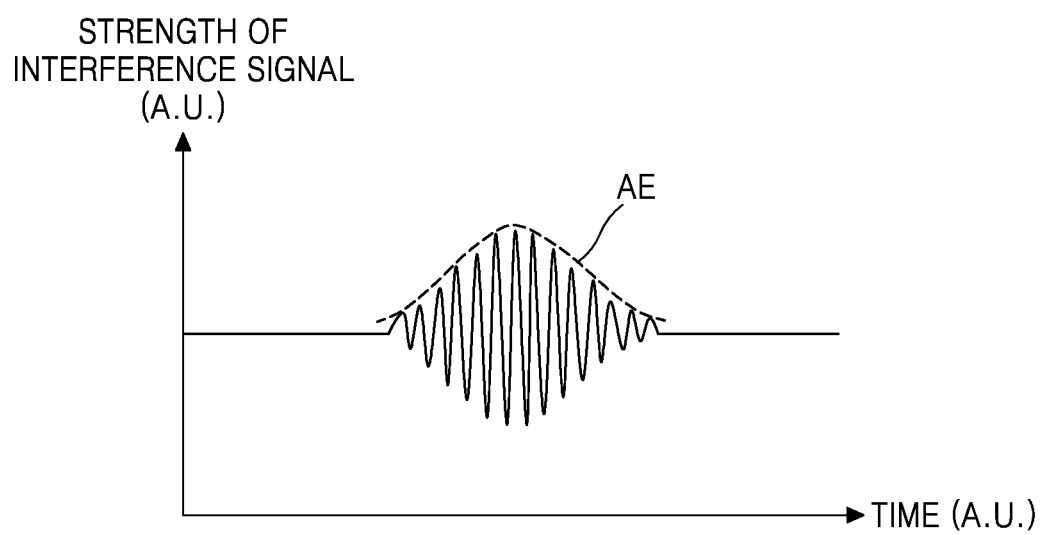
FIG. 4 is a graph illustrating the strength/intensity of an interference signal generated by a detector of a level sensor in a substrate processing apparatus, as time passes.

FIG. 1 is a configuration diagram illustrating a substrate processing apparatus 10 according to some embodiments. FIG. 2 is a configuration diagram schematically illustrating a prism 130 of a level sensor 100 in the substrate processing apparatus 10. FIG. 3 is a graph illustrating a change in an optical path length of light in an optical path length modulator 140 of the level sensor 100 in the substrate processing apparatus 10. FIG. 4 is a graph illustrating a strength/intensity of an interference signal which is generated by a detector 150 of the level sensor 100 in the substrate processing apparatus 10, as time passes.

Referring to FIGS. 1 to 4, the substrate processing apparatus 10 may be configured to detect a height level of a surface of a substrate 510 that is a processing object.

For example, the substrate 510 may include or may be a semiconductor substrate. The substrate 510 may include or may be a silicon wafer. Alternatively, the substrate 510 may include or be formed of a semiconductor element, such as germanium, or a compound semiconductor, such as silicon carbide (SiC), gallium arsenide (GaAs), indium arsenide (InAs), or indium phosphide (InP). Alternatively, the substrate 510 may have a silicon-on-insulator (SOI) structure. In some embodiments, the substrate 510 may include an impurity-doped well or an impurity-doped structure which is a conductive region. At least one material layer 520 may be formed on the substrate 510. The material layer 520 may include or may be a conductive layer such as a metal layer, an insulating layer, and/or a photoresist layer.

Herein, the substrate 510 may refer to the substrate 510 itself, or a stack structure that includes the substrate 510 and the material layer 520 formed on the substrate 510. For example, the substrate 510 may include a base substrate and the material layer 520 in certain embodiments. For example, the "surface of the substrate 510" may refer to an exposed surface of the substrate 510 itself, or an exposed surface of the material layer 520 formed on the substrate 510.

The substrate processing apparatus 10 may include a substrate stage 210 configured to support the substrate 510, and the level sensor 100 configured to detect the height level of the surface of the substrate 510 that is loaded on the substrate stage 210. Here, the height level may refer to a position of the surface in a Z direction. The height level of the surface of the substrate 510 may be defined as a difference between a reference height level and the height level of the surface of the substrate 510.

Spatially relative terms, such as "beneath," "below," "lower," "above," "upper," "height" and the like, may be used herein for ease of description to describe positional relationships. It will be understood that the spatially relative terms encompass different orientations of the device in addition to the orientation depicted in the figures.

The substrate stage 210 may support the substrate 510. The substrate 510 may be arranged on an upper surface of the substrate stage 210, and the substrate stage 210 may support the substrate 510 arranged on the upper surface thereof. In some embodiments, the substrate stage 210 may be configured to vacuum-suck the substrate 510. In some embodiments, the substrate stage 210 may include an electrostatic chuck configured to secure the substrate 510 by using electrostatic force. The upper surface of the substrate stage 210, by which the substrate 510 is supported, may be flat and may be on a plane parallel to an X direction and a Y direction and may be perpendicular to the Z direction.

The substrate stage 210 may include an actuator, such as a motor, and may be configured to be moved by the actuator. In some embodiments, the substrate stage 210 may move in the X direction and the Y direction on an XY plane and may also move in the Z direction that is perpendicular to the XY plane. In some embodiments, the substrate stage 210 may rotate about a rotation axis. The rotation axis of the substrate stage 210 may be parallel to one of the X direction, the Y direction, and the Z direction.

The level sensor 100 may include a measurement light source 111, a collimator 113, a slit plate 115, illumination optics 117, relay optics 119, a first polarizing plate 121, a prism 130, an optical path length modulator 140, a second polarizing plate 123, a condensing lens 125, and a detector 150.

The measurement light source 111 may generate and output measurement light ML. The measurement light source 111 may generate the measurement light ML and may radiate the measurement light ML toward the substrate 510 loaded on the substrate stage 210. The measurement light source 111 may include or be formed of a single light source or a plurality of light sources. In embodiments in which the measurement light source 111 includes the plurality of light sources, the light sources may be identical to each other or may be different from each other. The measurement light source 111 may generate and emit light having a broadband wavelength. In certain embodiments, the measurement light source 111 may generate and emit light having a single wavelength or a narrowband wavelength. The measurement light ML generated by the measurement light source 111 may have a wavelength in ultraviolet, visible, near-infrared, and infrared ranges. In some embodiments, the measurement light source 111 may generate and emit the measurement light ML in a band of about 200 nm to about 2100 nm. In some embodiments, the measurement light source 111 may generate and emit coherent light. In some embodiments, the measurement light source 111 may be configured to emit white light. The measurement light source 111 may include, but is not limited to, a halogen ramp light source that generates continuous-spectrum light, a light-emitting diode (LED) light source, or a laser light source.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The measurement light ML emitted from the measurement light source 111 may be radiated onto the slit plate 115 through the collimator 113. The slit plate 115 may be arranged on an optical path of the measurement light ML, which extends between the measurement light source 111 and the substrate 510. The slit plate 115 may include at least one slit 1151 and may have a flat plate shape. A main surface of the slit plate 115 may be approximately/substantially perpendicular to a traveling direction of the measurement light ML output from the measurement light source 111. The measurement light ML emitted from the measurement light source 111 may pass through the slit 1151 of the slit plate 115 and then be radiated toward the substrate 510, and the measurement light ML may be radiated onto the substrate 510 while having a shape corresponding to the shape of the slit 1151. The slit plate 115 may include one slit 1151 or a plurality of slits 1151. The slit 1151 may have a line shape, a spot shape, a dotted line shape, and/or a dash-single dotted line shape.

Terms such as "same," "equal," "parallel," "perpendicular," "planar," or "coplanar," as used herein encompass identicality or near identicality including variations that may occur, for example, due to manufacturing processes. The term "substantially" may be used herein to emphasize this meaning, unless the context or other statements indicate otherwise.

The measurement light ML having passed through the slit plate 115 may be radiated onto the substrate 510 through the illumination optics 117. The illumination optics 117 may include or be formed of one or more lenses, one or more mirrors, or a combination thereof. The illumination optics 117 may cause/guide the measurement light ML to be radiated onto the substrate 510, which is loaded on the substrate stage 210, by reflecting and/or focusing the measurement light ML having passed through the slit plate 115. Herein, the measurement light source 111, the collimator 113, the slit plate 115, and the illumination optics 117 may constitute input optics configured to generate the measurement light ML and radiate the measurement light ML onto the substrate 510.

Reflected light RL of the measurement light ML, which is reflected by the surface of the substrate 510, may sequentially pass through the relay optics 119, the first polarizing plate 121, the prism 130, the optical path length modulator 140, the second polarizing plate 123, and the condensing lens 125 in the stated order and then be input to the detector 150.

The relay optics 119 may include or be formed of one or more lenses, one or more mirrors, or a combination thereof and may be configured to image the reflected light RL on an incidence surface 131 of the prism 130. For example, the relay optics 119 may be configured to transfer the reflected light RL to be incident and/or focused on the incidence surface 131 of the prism 130. For example, the relay optics 119 may be configured to have an optical magnification of about 10 to about 100.

The first polarizing plate 121 may polarize the reflected light RL having passed through the relay optics 119 and may output the polarized reflected light RL to the prism 130. For example, the polarization by the first polarizing plate 121 may be linear polarization. The first polarizing plate 121 may have a polarization axis that is inclined with respect to a polarization direction of first polarized light PE and a polarization direction of second polarized light PO in the prism 130 described below. For example, when the polarization direction of the first polarized light PE and the polarization direction of the second polarized light PO in the prism 130 are 0 degrees and 90 degrees, respectively, the first polarizing plate 121 may have a polarization axis at 45 degree. For example, the first polarizing plate 121 may have a polarization axis that is inclined at 45 degrees with respect to each of the polarization direction of the first polarized light PE and the polarization direction of the second polarized light PO.

The reflected light RL, which is polarized by the first polarizing plate 121, may be radiated onto the incidence surface 131 of the prism 130. The incidence surface 131 of the prism 130 may include an image plane on which the shape of the substrate 510 is imaged by the reflected light RL. For example, the incidence surface 131 of the prism 130 may be positioned on a plane on which the reflected light RL is focused to form an image of the substrate 510. The prism 130 may split the polarized reflected light RL into the first polarized light PE having a first polarization direction and the second polarized light PO having a second polarization direction. The first polarization direction and the second polarization direction may be orthogonal to each other. In a region between the incidence surface 131 and an exit surface 133 of the prism 130, an optical path length of the first polarized light PE is different from an optical path length of the second polarized light PO, and thus, there may be an optical path length difference (OPD) between the first polarized light PE and the second polarized light PO, which are output from the prism 130.

In the prism 130, the OPD between the first polarized light PE and the second polarized light PO may be determined based on an incidence height HH of the reflected light RL on the incidence surface 131 of the prism 130. The incidence height HH of the reflected light RL on the prism 130 may be defined as a distance from a preset reference position H0 on the incidence surface 131 of the prism 130 to an incidence position of the reflected light RL on the incidence surface 131 of the prism 130, and the reference position H0 on the incidence surface 131 of the prism 130 may be defined as a position where the OPD generated between the first polarized light PE and the second polarized light PO by the prism 130 is minimum. For example, in the prism 130, the incidence height HH of the reflected light RL may be about 10 μm to about 200 μm.

In the prism 130, the incidence height HH of the reflected light RL may be represented by Equation (1).

$$\Delta H = \Delta z \cdot m \cdot 2 \sin \theta \qquad \text{Equation (1)}$$

Figure 6:
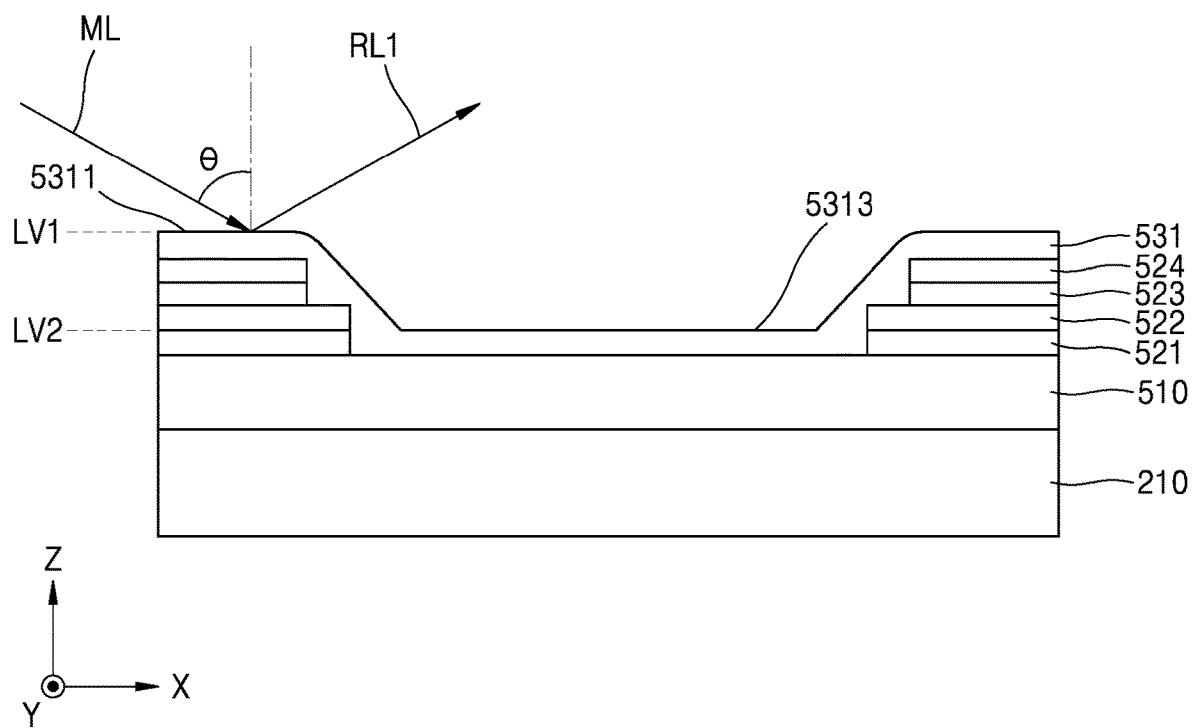
FIGS. 6 and 7 are cross-sectional views, each schematically illustrating a substrate loaded on a substrate stage.

In Equation (1), $\Delta H$ may denote the incidence height HH of the reflected light RL on the prism 130, $\Delta z$ may denote a difference between the reference height level and the height level of the surface of the substrate 510, m may denote the optical magnification of the relay optics 119, and $\theta$ may denote an incidence angle of the measurement light ML incident on the surface of the substrate 510 (e.g., as shown in FIG. 6).

In some embodiments, the OPD between the first polarized light PE and the second polarized light PO may linearly change in proportion to the incidence height HH of the reflected light RL. In some embodiments, the OPD generated between the first polarized light PE and the second polarized light PO by the prism 130 may be determined by the incidence height HH of the reflected light RL and may have a value of about 1/1000 times to about 1/15 times the incidence height HH of the reflected light RL.

The prism 130 may include two or more birefringent structures (for example, quartz) that are bonded to each other. The prism 130 may include or may be, but is not limited to, a Nomarski prism. For example, the prism 130 may include at least one of a Nomarski prism, a Wollaston prism, and a Rochon prism. For example, the prism 130 may be a Nomarski prism, a Wollaston prism, or a Rochon prism.

In some embodiments, the prism 130 may include or may be a single prism or a combination of a plurality of prisms. For example, the prism 130 may be formed of multiple components of prisms. For example, each of the components of prisms may be a kind of prism. For example, each of the components of prisms may be formed of a birefringent material.

The first polarized light PE and the second polarized light PO, which are output from the prism 130, may be radiated onto an incidence surface (141 of FIG. 9) of the optical path length modulator 140. The optical path length modulator 140 may modulate an optical path length of one of the first polarized light PE and the second polarized light PO. For example, in a region between the incidence surface 141 and an exit surface (143 of FIG. 9) of the optical path length modulator 140, the optical path length of the first polarized light PE may be unchanged and maintained constant over time, and the optical path length of the second polarized light PO may be modulated over time. In some embodiments, in the optical path length modulator 140, the optical path length of the second polarized light PO may periodically change. In some embodiments, in the optical path length modulator 140, the optical path length of the second polarized light PO may change to have a repeating waveform, such as a sinusoidal wave form. Here, in the optical path length modulator 140, an optical path length change cycle may be defined as time taken from a time point at which the optical path length of the second polarized light PO has a specific value until the next time point at which the optical path length of the second polarized light PO has the specific value again. Because the optical path length of the second polarized light PO is modulated or changed by the optical path length modulator 140, the modulated OPD between the first polarized light PE and the second polarized light PO, which are output from the optical path length modulator 140, may change over time and be 0 (zero) at a certain time point. A time point in the present disclosure may be a point in time or a specified instant.

The optical path length modulator 140 may generate a density change in a first direction in a structure, e.g., forming the optical path length modulator, through which the reflected light RL passes, and thus, may periodically change only a refractive index in the first direction in the structure. The structure of the optical path length modulator 140 may include, for example, an optically anisotropic material or an optically isotropic material. By controlling external force applied to the structure of the optical path length modulator 140, while causing the refractive index of the structure of the optical path length modulator 140 in the first direction to periodically change, the refractive index thereof in a second direction, which is perpendicular to the first direction, may be made constant. In the optical path length modulator 140, the first direction may correspond to the polarization direction of the second polarized light PO, and the second direction may correspond to the polarization direction of the first polarized light PE.

In some embodiments, the optical path length modulator 140 may include or may be a photo-elastic modulator. However, the inventive concept is not limited thereto, and the optical path length modulator 140 may include at least one of a photo-elastic modulator, an electro-optic modulator, and an acousto-optic modulator. For example, the optical path length modulator 140 may be a photo-elastic modulator, an electro-optic modulator, or an acousto-optic modulator.

The second polarizing plate 123 may polarize the first polarized light PE and the second polarized light PO, which are output from the optical path length modulator 140. The second polarizing plate 123 may have a polarization axis inclined with respect to each of the polarization direction of the first polarized light PE and the polarization direction of the second polarized light PO. For example, when the polarization direction of the first polarized light PE and the polarization direction of the second polarized light PO are 0 degrees and 90 degrees, respectively, the polarization axis of the second polarizing plate 123 may be at 45 degrees. For example, the second polarizing plate 123 may have a polarization axis that is inclined at 45 degrees with respect to each of the polarization direction of the first polarized light PE and the polarization direction of the second polarized light PO. In some embodiments, the polarization axis of the first polarizing plate 121 and the polarization axis of the second polarizing plate 123 may be parallel to each other.

The first polarized light PE and the second polarized light PO, which are output from the second polarizing plate 123, may be input to the detector 150 through the condensing lens 125. The second polarizing plate 123 may cause/align the first polarized light PE and the second polarized light PO, which are split by the prism 130, to have the same direction, and the first polarized light PE and the second polarized light PO, which are output from the second polarizing plate 123, may be in a state interfering with each other. For example, in certain embodiments, the second polarizing plate 123 may remove noise/deviation of light having a different polarization direction from the polarization axis of the second polarizing plate 123 from a combination of the first polarized light PE and the second polarized light PO.

The detector 150 may receive the first polarized light PE and the second polarized light PO, which are output from the optical path length modulator 140, and may detect the OPD generated between the first polarized light PE and the second polarized light PO by the prism 130, based on an interference signal generated by interference between the first polarized light PE and the second polarized light PO. The detector 150 may detect data for the OPD generated between the first polarized light PE and the second polarized light PO by the prism 130 and may detect the height level of the surface of the substrate 510 based on the data. For example, the height level of the surface of the substrate 510 may depend on the OPD. For example, the detector 150 may receive a combination of the first polarized light PE and the second polarized light PO. For example, the detector 150 may detect intensities of the combination of the first polarized light PE and the second polarized light PO which may vary as time goes by. For example, the detector 150 may detect intensities of the combination of the first polarized light PE and the second polarized light PO while the optical path length modulator 140 modulate the optical path length of the second polarized light OP. For example, the detector 150 may detect a height/level of a position or a difference of heights/levels of two different positons of a surface of the substrate 510 based on the intensities of the combination of the first polarized light PE and the second polarized light PO.

The detector 150 may include a light-receiving device 151 configured to receive the first polarized light PE and the second polarized light PO. In some embodiments, the light-receiving device 151 may include a photodiode, a camera, or the like. For example, the light-receiving device 151 may include a single photodiode, a photodiode array including a plurality of photodiodes, a line camera, and/or a 2-dimensional (2D) camera.

The detector 150 may include a processor 153. The processor 153 may process a signal received by the light-receiving device 151. The processor 153 may generate data for a strength/intensity profile of the interference signal generated by the interference between the first polarized light PE and the second polarized light PO, and may detect the OPD generated between the first polarized light PE and the second polarized light PO by the prism 130, based on the data for the strength/intensity profile of the interference signal. When a change amount of the optical path length (e.g., a displacement of the optical path) of the second polarized light PO, which is changed/obtained by the optical path length modulator 140, is equal to the OPD generated between the first polarized light PE and the second polarized light PO by the prism 130, the OPD between the first polarized light PE and the second polarized light PO on an incidence surface of the light-receiving device 151 is 0 (zero), and the strength (or amplitude), detected by the detector 150, of the interference signal between the first polarized light PE and the second polarized light PO may be at a peak point. Therefore, the processor 153 may detect the peak point of the strength (e.g., intensity/amplitude) of the interference signal, based on the data for the strength profile of the interference signal, and may detect the OPD generated between the first polarized light PE and the second polarized light PO by the prism 130, based on the detected peak point of the interference signal. In some embodiments, the detector 150 may detect an amplitude envelope (AE) for the strength profile of the interference signal and may detect the peak point of the interference signal from the AE. In some embodiments, the detector 150 may process the interference signal between the first polarized light PE and the second polarized light PO with a fast Fourier transform (FFT) algorithm and may detect the peak point of the interference signal through frequency analysis using the FFT algorithm.

As described above, the OPD generated between the first polarized light PE and the second polarized light PO by the prism 130 is a value determined by the incidence height HH of the reflected light RL on the prism 130, and the incidence height HH of the reflected light RL on the prism 130 may be detected by using the value of the OPD generated between the first polarized light PE and the second polarized light PO due the prism 130. In addition, referring to Equation (1) described above, the height level of the surface of the substrate 510 may be detected by using the detected incidence height HH of the reflected light RL on the prism 130, the optical magnification of the relay optics 119, and the incidence angle (θ of FIG. 6) of the measurement light ML incident on the surface of the substrate 510.

In some embodiments, a sampling cycle of the detector 150 (that is, a cycle of obtaining interference light between the first polarized light PE and the second polarized light PO, which are input to the light-receiving device 151) may be equal to or less than about ¼ times and greater than about 1/2000 times the optical path length change cycle of the optical path length modulator 140. For example, a sampling rate of the detector 150 may be equal to or greater than 4 times and equal to or less than 2000 times the optical path length change rate of the optical path length modulator 140.

The processor 153 may include or may be a microprocessor, a central processing unit (CPU), a graphics processing unit (GPU), or the like. In addition, the detector 150 may include a memory device for storing signals to be input to the processor 153, signals that is output from the processor 153, various programming commands for driving the processor 153, and signals provided by other external devices. The memory device may include or may be, for example, read-only memory (ROM), random access memory (RAM), or the like.

The substrate processing apparatus 10 may further include an exposure head 220 configured to radiate exposure light EL having a circuit pattern onto the substrate 510 loaded on the substrate stage 210. The exposure head 220 may be configured to perform an exposure process on the substrate 510, based on information about the height level of the surface of the substrate 510, which is detected by the level sensor 100. The exposure head 220 may include an exposure light source 221, a mask table 223, and projection optics 225.

The exposure light source 221 may provide the exposure light EL to an exposure mask EM. The exposure light source 221 may output a laser beam. For example, the exposure light source 221, as a laser light source, may output an excimer laser beam having a wavelength of about 200 nm to about 400 nm. For example, the exposure light source 221 may output an ArF excimer laser beam having a wavelength of 193 nm, or a KrF excimer laser beam having a wavelength of about 248 nm. In some embodiments, the exposure light source 221 may include an extreme ultraviolet (EUV) light source configured to output EUV light. For example, the EUV light may have a wavelength of about 4 nm to about 124 nm, about 4 nm to about 20 nm, or 13.5 nm. The EUV light source, as a plasma-based light source, may include a laser-produced plasma (LPP) light source, a discharge-produced plasma (DPP) light source, or the like.

The mask table 223 may support the exposure mask EM (for example, a reticle) on which a mask pattern (e.g., a circuit pattern) is formed. The mask table 223 may include an actuator, such as a motor, and may be configured to be moved by the actuator. In some embodiments, the mask table 223 may be configured to move in the X direction and the Y direction on the XY plane.

The projection optics 225 may be arranged between the exposure mask EM and the substrate stage 210. The projection optics 225 may receive the exposure light EL output from the exposure mask EM, and the exposure light EL may be projected and imaged on the substrate 510, which is loaded on the substrate stage 210, through the projection optics 225. As the exposure light EL is incident on the substrate 510 through the projection optics 225, an image corresponding to the mask pattern (e.g., the circuit pattern) of the exposure mask EM may be projected on the substrate 510. The projection optics 225 may include or be formed of one or more lenses, one or more mirrors, or a combination thereof.

FIG. 1 illustrates an example, in which the exposure mask EM is a transmissive mask, and in which the exposure light EL emitted from the exposure light source 221 passes through the exposure mask EM and then is incident on the substrate 510 through the projection optics 225. However, the inventive concept is not limited thereto, the exposure mask EM may be a reflective mask, and light emitted from the exposure light source 221 may be reflected by the exposure mask EM and then incident on the substrate 510 through the projection optics 225.

In some embodiments, a substrate processing method using the substrate processing apparatus 10 may include preparing the substrate 510 having one or more material layers 520, forming a photoresist layer on the one or more material layers 520 of the substrate 510, performing exposure for transferring the mask pattern (e.g., the circuit pattern) of the exposure mask EM onto the photoresist layer, performing development for removing a portion (for example, an exposed region) of the photoresist layer having undergone the exposure, etching portions of the material layers 520, which are exposed by the photoresist layer having undergone the development, and removing the photoresist layer. The performing of the exposure set forth above may include detecting a height level of a surface of a processing object region of the substrate 510 by using the level sensor 100.

Figure 5A:
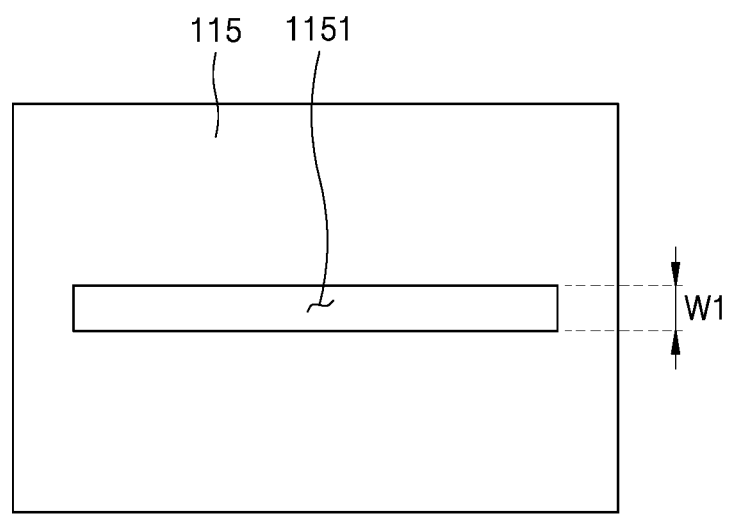
FIGS. 5A to 5C are diagrams, each illustrating a slit plate according to some embodiments.
Figure 5B:
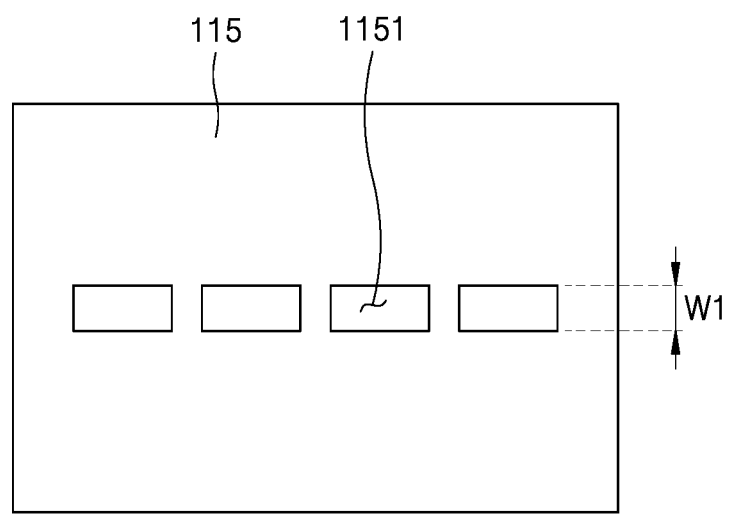
Figure 5C:
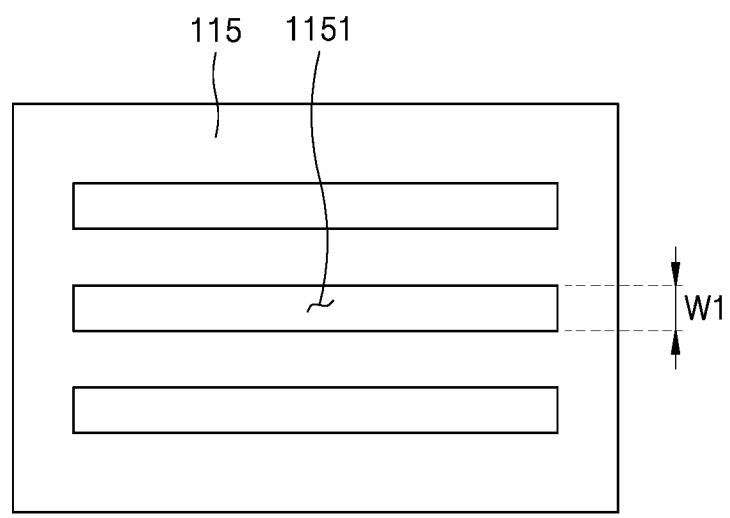

FIGS. 5A to 5C are diagrams, each illustrating the slit plate 115 according to some embodiments.

Referring to FIG. 5A, the slit plate 115 may include the slit 1151 having a major axis and a minor axis. The slit 1151 may have a line or bar shape linearly extending in the major-axis direction. The major-axis direction and the minor-axis direction of the slit 1151 may be perpendicular to each other. A width W1 of the slit 1151 in the minor-axis direction may be about 10 μm to about 200 μm.

Referring to FIG. 5B, the slit plate 115 may include a plurality of slits 1151 arranged in a line in one direction, e.g., in a lengthwise direction of each slit. The plurality of slits 1151 may be arranged in a dotted line shape or a dash-single dotted line shape in the one direction, e.g., in the lengthwise direction of each slit.

Referring to FIG. 5C, the slit plate 115 may include a plurality of slits 1151, each having a line or bar shape. Each of the plurality of slits 1151 may have a major axis and a minor axis. The major axis of each slit may be parallel to its lengthwise direction, and the minor axis of each slit may be perpendicular to its major axis. The plurality of slits 1151 may be spaced apart from each other in the minor-axis direction of each of the plurality of slits 1151.

FIGS. 6 to 12 are diagrams illustrating a method of detecting the height level of the surface of the substrate 510 by using the substrate processing apparatus 10 described with reference to FIGS. 1 to 4. Hereinafter, the method of detecting the height level of the surface of the substrate 510 by using the level sensor 100 of the substrate processing apparatus 10 according to some embodiments is described with reference to FIGS. 6 to 12 together with FIG. 1.

Figure 7:
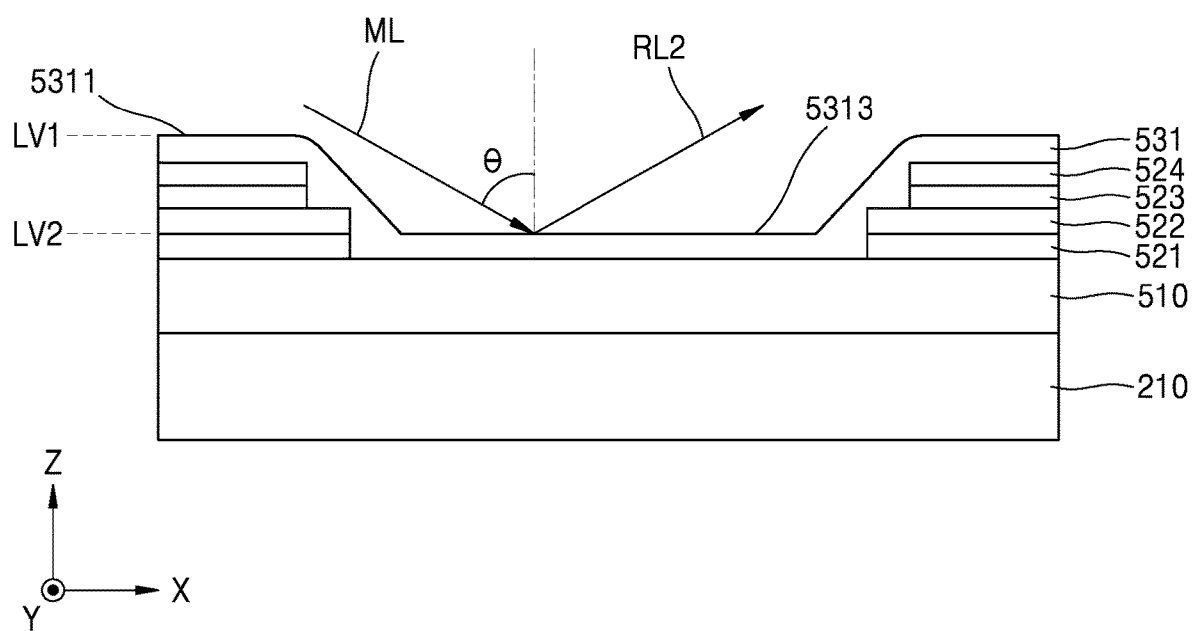

FIGS. 6 and 7 are cross-sectional views, each schematically illustrating the substrate 510 loaded on the substrate stage 210.

Referring to FIGS. 6 and 7, the substrate 510 may be loaded on the substrate stage 210. The substrate 510 may include a plurality of material layers 521, 522, 523, and 524 stacked in the stated order in a vertical direction, and a photoresist layer 531 covering the plurality of material layers 521, 522, 523, and 524. Each of the plurality of material layers 521, 522, 523, and 524 may include or may be a conductive layer or an insulating layer. The plurality of material layers 521, 522, 523, and 524 may be stacked in a stepwise structure. The photoresist layer 531 may extend along a contour formed by the plurality of material layers 521, 522, 523, and 524 and the substrate 510, and an exposed upper surface of the photoresist layer 531 may have a surface step height, e.g., including different heights in the surface. The surface step height of the exposed upper surface of the photoresist layer 531 may refer to a difference between a first height level LV1 of a first upper surface 5311 of the photoresist layer 531 and a second height level LV2 of a second upper surface 5313 of the photoresist layer 531. In some embodiments, in the photoresist layer 531, the difference between the first height level LV1 of the first upper surface 5311 and the second height level LV2 of the second upper surface 5313 may be greater than 20 μm. Height levels in the present disclosure may also be understood as heights or levels.

An incidence point of the measurement light ML on the substrate 510 may be moved by a relative movement between the substrate stage 210 and the measurement light source 111. For example, by a movement of the substrate stage 210 in the X direction with respect to the measurement light source 111, the incidence point of the measurement light ML on the substrate 510 may be moved in a direction opposite to the X direction. In FIG. 6, the measurement light ML may be incident on the first upper surface 5311 of the photoresist layer 531, and first reflected light RL1 reflected by the first upper surface 5311 may travel toward the detector 150. In FIG. 7, the measurement light ML may be incident on the second upper surface 5313 of the photoresist layer 531, and second reflected light RL2 reflected by the second upper surface 5313 may travel toward the detector 150.

Figure 8:
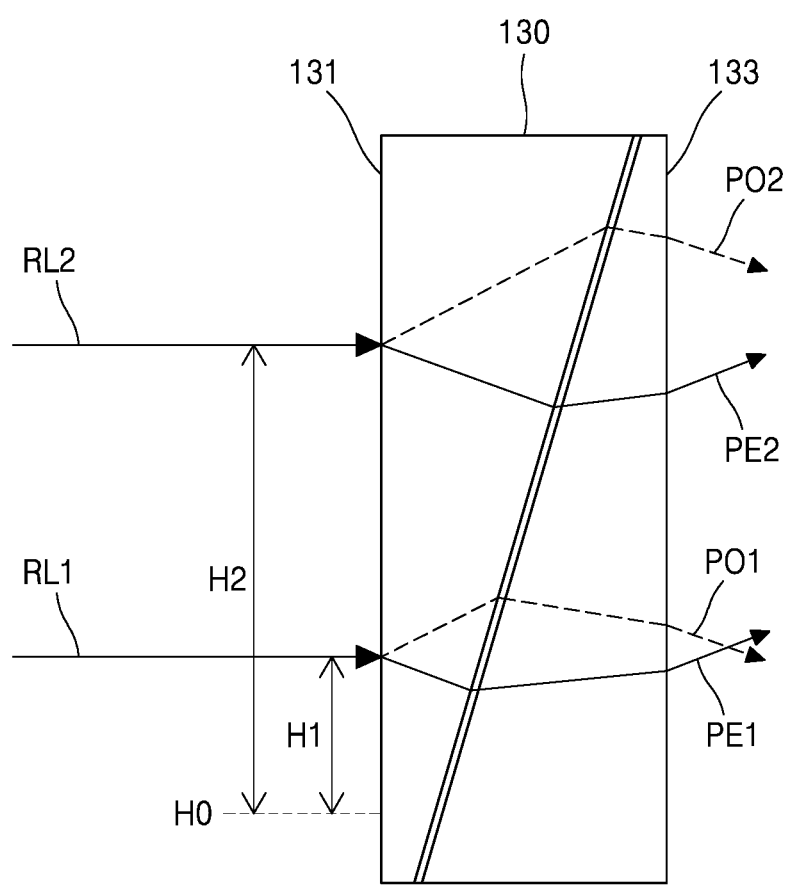
FIG. 8 is a configuration diagram schematically illustrating an optical path of first reflected light and an optical path of second reflected light, in a prism.

FIG. 8 is a configuration diagram schematically illustrating an optical path of the first reflected light RL1 and an optical path of the second reflected light RL2 in the prism 130.

Referring to FIG. 8, the first reflected light RL1 and the second reflected light RL2 may be incident on the incidence surface 131 of the prism 130 through the first polarizing plate 121. Because the first reflected light RL1 and the second reflected light RL2 are respectively reflected by different portions of the upper surface (e.g., having different heights/levels) of the photoresist layer 531, the first reflected light RL1 and the second reflected light RL2 may be incident on the incidence surface 131 of the prism 130 at different incidence heights from each other. The first reflected light RL1 may be incident on the incidence surface 131 of the prism 130 at a first incidence height H1, and the second reflected light RL2 may be incident on the incidence surface 131 of the prism 130 at a second incidence height H2 that is greater than the first incidence height H1.

In the prism 130, the first reflected light RL1 may be split into third polarized light PE1 and fourth polarized light PO1, and the second reflected light RL2 may be split into fifth polarized light PE2 and sixth polarized light PO2. Each of the third polarized light PE1 of the first reflected light RL1 and the fifth polarized light PE2 of the second reflected light RL2 may have a first polarization direction, and each of the fourth polarized light PO1 of the first reflected light RL1 and the sixth polarized light PO2 of the second reflected light RL2 may have a second polarization direction that is perpendicular to the first polarization direction. A first OPD may be generated between the third polarized light PE1 and the fourth polarized light PO1, which are output from the prism 130, and a second OPD may be generated between the fifth polarized light PE2 and the sixth polarized light PO2, which are output from the prism 130. Because an OPD generated by the prism 130 is proportional to an incidence height of reflected light on the prism 130, the second OPD may be greater than the first OPD.

Figure 9:
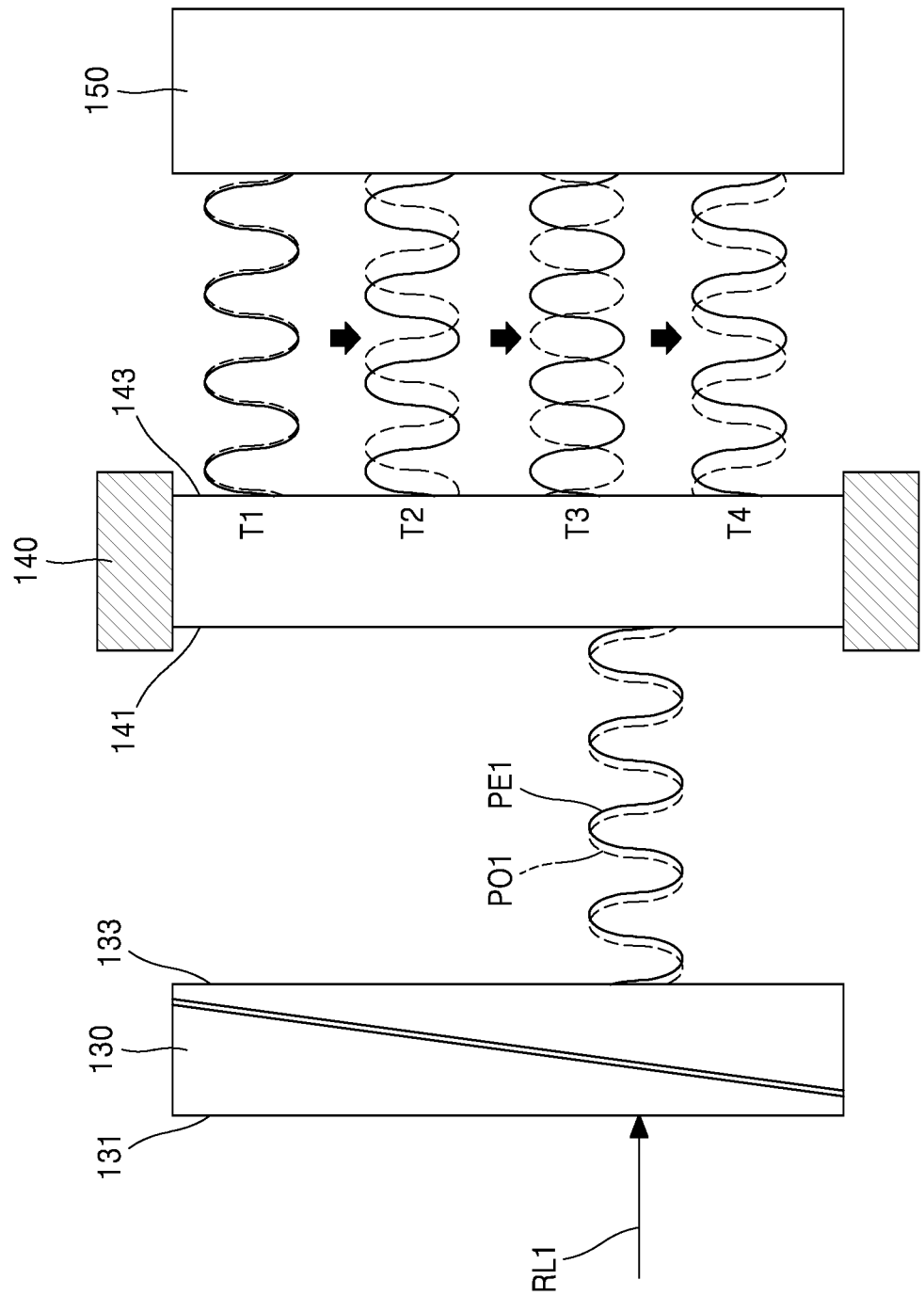
FIG. 9 is a configuration diagram schematically illustrating a process in which third polarized light and fourth polarized light of first reflected light, which are output from a prism, are received by a detector.
Figure 10:
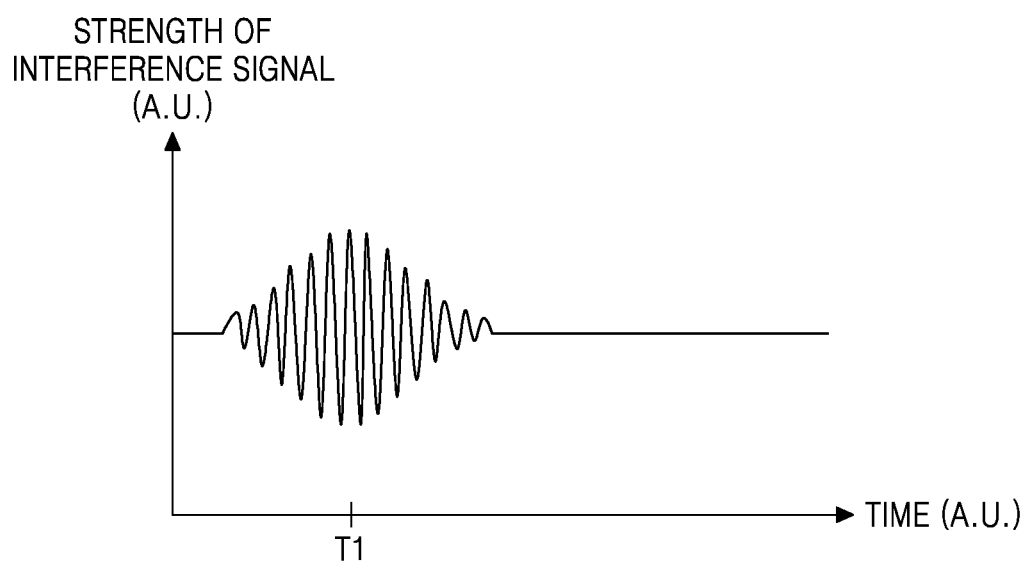
FIG. 10 is a graph illustrating the strength/intensity of an interference signal generated by interference between third polarized light and fourth polarized light, which are output from an optical path length modulator, as time passes.

FIG. 9 is a configuration diagram schematically illustrating a process where the third polarized light PE1 and the fourth polarized light PO1 of the first reflected light RL1, which are output from the prism 130, are received by the detector 150. In FIG. 9, respective waveforms of the third polarized light PE1 and the fourth polarized light PO1, which are output from the optical path length modulator 140, are schematically illustrated at a first time point T1, a second time point T2, a third time point T3, and a fourth time point T4, as time passes. In FIG. 9, for simplicity, the illustration of the second polarizing plate 123 and the condensing lens 125 is omitted. FIG. 10 is a graph illustrating the strength/intensity of an interference signal generated due to interference between the third polarized light PE1 and the fourth polarized light PO1, as time passes.

Referring to FIGS. 9 and 10, the third polarized light PE1 and the fourth polarized light PO1, which are output from the prism 130, are incident on the incidence surface 141 of the optical path length modulator 140. The optical path length modulator 140 may control an optical path length of the third polarized light PE1 to be constant and may periodically change or modulate an optical path length of the fourth polarized light PO1. In the optical path length modulator 140, a change in the optical path length of the third polarized light PE1 may be 0, and the optical path length of the fourth polarized light PO1 may change to have a repeating waveform, such as a sinusoidal wave form.

While the optical path length of the fourth polarized light PO1 in the optical path length modulator 140 changes, a modulated OPD between the third polarized light PE1 and the fourth polarized light PO1, which are output from the optical path length modulator 140, changes over time, and the strength/intensity of the interference signal generated due to the interference between the third polarized light PE1 and the fourth polarized light PO1 also changes over time. When a change amount of the optical path length (e.g., a displacement of the optical path) of the fourth polarized light PO1 generated by the optical path length modulator 140 is equal to the first OPD generated between the third polarized light PE1 and the fourth polarized light PO1 by the prism 130, the modulated OPD between the third polarized light PE1 and the fourth polarized light PO1, which are output from the optical path length modulator 140, is 0 (zero), and the strength of the interference signal is at a peak point. Therefore, the detector 150 may detect the peak point at which the strength of the interference signal is greatest, and may detect the first OPD generated between the third polarized light PE1 and the fourth polarized light PO1 by the prism 130, based on the detected peak point. In addition, a height level of the first upper surface 5311 of the photoresist layer 531 may be detected by using the detected first OPD between the third polarized light PE1 and the fourth polarized light PO1.

Figure 11:
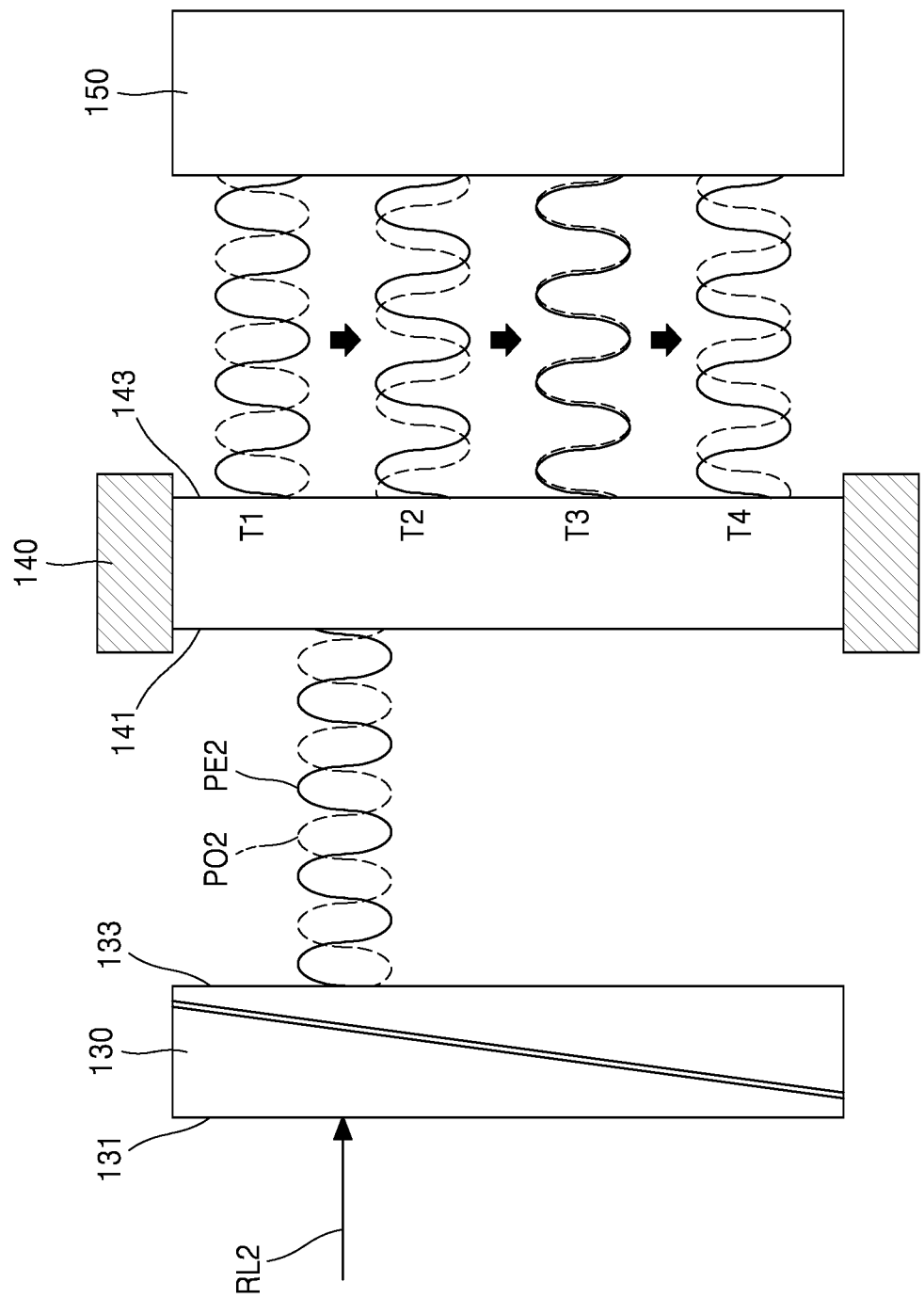
FIG. 11 is a configuration diagram schematically illustrating a process in which fifth polarized light and sixth polarized light of second reflected light, which are output from a prism, are received by a detector.
Figure 12:
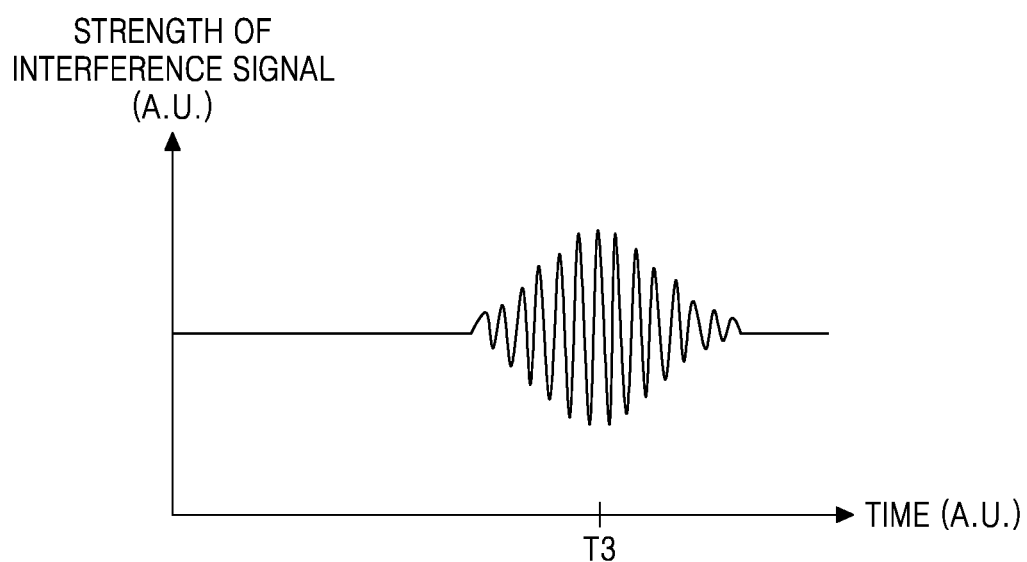
FIG. 12 is a graph illustrating the strength/intensity of an interference signal generated by interference between fifth polarized light and sixth polarized light, which are output from an optical path length modulator, as time passes.

FIG. 11 is a configuration diagram schematically illustrating a process where the fifth polarized light PE2 and the sixth polarized light PO2 of the second reflected light RL2, which are output from the prism 130, are received by the detector 150. In FIG. 11, respective waveforms of the fifth polarized light PE2 and the sixth polarized light PO2, which are output from the optical path length modulator 140, are schematically illustrated at the first time point T1, the second time point T2, the third time point T3, and the fourth time point T4, as time passes. In FIG. 11, for simplicity, the illustration of the second polarizing plate 123 and the condensing lens 125 is omitted. FIG. 12 is a graph illustrating the strength of an interference signal generated due to interference between the fifth polarized light PE2 and the sixth polarized light PO2, as time passes.

Referring to FIGS. 11 and 12, because the first incidence height H1 of the first reflected light RL1 on the prism 130 is different from the second incidence height H2 of the second reflected light RL2 on the prism 130, a second OPD generated between the fifth polarized light PE2 and the sixth polarized light PO2 by the prism 130 may be different from the first OPD generated between the third polarized light PE1 and the fourth polarized light PO1 by the prism 130.

The fifth polarized light PE2 and the sixth polarized light PO2, which are output from the prism 130, are incident on the incidence surface 141 of the optical path length modulator 140. The optical path length modulator 140 may control an optical path length of the fifth polarized light PE2 to be constant and may periodically change or modulate an optical path length of the sixth polarized light PO2. In the optical path length modulator 140, a change in the optical path length of the fifth polarized light PE2 may be 0, and the optical path length of the sixth polarized light PO2 may change to have a repeating waveform, such as a sinusoidal wave form. Because the second OPD generated between the fifth polarized light PE2 and the sixth polarized light PO2 by the prism 130 is different from the first OPD generated between the third polarized light PE1 and the fourth polarized light PO1 by the prism 130, a modulated OPD between the fifth polarized light PE2 and the sixth polarized light PO2, which are output from the optical path length modulator 140, may be different from the modulated OPD between the third polarized light PE1 and the fourth polarized light PO1, which are output from the optical path length modulator 140, at the same sampling time point (for example, the first time point T1).

While the optical path length of the sixth polarized light PO2 in the optical path length modulator 140 changes, the modulated OPD between the fifth polarized light PE2 and the sixth polarized light PO2, which are output from the optical path length modulator 140, changes over time, and the strength of the interference signal generated due to the interference between the fifth polarized light PE2 and the sixth polarized light PO2 also changes over time. When a change amount of the optical path length (e.g., a displacement of the optical path) of the sixth polarized light PO2 made by the optical path length modulator 140 is equal to the second OPD generated between the fifth polarized light PE2 and the sixth polarized light PO2 by the prism 130, the modulated OPD between the fifth polarized light PE2 and the sixth polarized light PO2, which are output from the optical path length modulator 140, is 0 (zero), and the strength of the interference signal is at a peak point. Therefore, the detector 150 may detect the peak point at which the strength (e.g., intensity/amplitude) of the interference signal is greatest, and may detect the second OPD generated between the fifth polarized light PE2 and the sixth polarized light PO2 by the prism 130, based on the detected peak point. In addition, a height level of the second upper surface 5313 of the photoresist layer 531 may be detected by using the detected second OPD between the fifth polarized light PE2 and the sixth polarized light PO2.

In some embodiments, the substrate processing method using the substrate processing apparatus 10 may include preparing the substrate 510 having the plurality of material layers 521, 522, 523, and 524 and the photoresist layer 531, detecting the height level of the surface of the photoresist layer 531, and performing an exposure process on the substrate 510 based on information about the detected height level of the surface of the photoresist layer 531.

In some embodiments, the substrate processing apparatus 10 may perform a first exposure operation for performing an exposure process on the first upper surface 5311 of the photoresist layer 531, and a second exposure operation for performing an exposure process on the second upper surface 5313 of the photoresist layer 531. In the first exposure operation, through a relative movement between the substrate stage 210 and the measurement light source 111, an incidence position of the measurement light ML and a focusing position of the exposure light EL are each located on the first upper surface 5311 of the photoresist layer 531. In the first exposure operation, the level sensor 100 may detect the height level of the first upper surface 5311 of the photoresist layer 531, and the projection optics 225 may adjust the focus of the exposure light EL to be within an allowed range of a depth of focus, based on the detected height level of the first upper surface 5311 of the photoresist layer 531. In addition, in the second exposure operation, through a relative movement between the substrate stage 210 and the measurement light source 111, the incidence position of the measurement light ML and the focusing position of the exposure light EL are each located on the second upper surface 5313 of the photoresist layer 531. In the second exposure operation, the level sensor 100 may detect the height level of the second upper surface 5313 of the photoresist layer 531, and the projection optics 225 may adjust the focus of the exposure light EL to be within the allowed range of the depth of focus, based on the detected height level of the second upper surface 5313 of the photoresist layer 531.

The substrate processing method described above is a part of a method of manufacturing semiconductor devices. Therefore, according to an embodiment of the present disclosure, a method of manufacturing a semiconductor device may include the substrate processing method disclosed above, and may further include other steps of semiconductor device manufacturing processes, e.g., dicing the substrate into semiconductor chips, packaging the diced semiconductor chips, etc. As an example, the semiconductor devices may be semiconductor packages and/or semiconductor chips.

General level sensors detect height levels of surfaces of products, which are objects to be processed, by using trigonometry. When there are high surface steps in products, there is an issue of the deterioration in detection performance (for example, resolution) in such general level sensors. Therefore, general level sensors have relatively low detection ranges in the Z direction.

However, according to some embodiments, the level sensor 100 is configured to detect the height level of the surface of the substrate 510 by an interference method, and thus, may detect the height level of the surface of the substrate 510 without deterioration in detection performance, even when there is a high surface step in the substrate 510 and/or there is warpage in the substrate 510. Because the level sensor 100 exhibits high detection performance while having a high detection range in the Z direction, the reliability of the level sensor 100 and the reliability of the substrate processing apparatus 10 including the level sensor 100 may improve.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

While the inventive concept has been particularly shown and described with reference to embodiments thereof, it will be understood that various changes in form and details may be made therein without departing from the spirit and scope of the following claims.

What is claimed is:

1. A level sensor configured to detect a height level of a substrate, the level sensor comprising:
a measurement light source configured to radiate measurement light toward the substrate;
a prism configured to split reflected light of the measurement light, which is reflected by the substrate, into first polarized light and second polarized light and generate a first optical path length difference between the first polarized light and the second polarized light;
an optical path length modulator configured to keep constant an optical path length of the first polarized light and periodically change an optical path length of the second polarized light; and
a detector configured to receive the first polarized light and the second polarized light, which are output from the optical path length modulator, and detect the first optical path length difference, based on an interference signal generated by interference between the first polarized light and the second polarized light.

2. The level sensor of claim 1, further comprising:
a first polarizing plate configured to be arranged between the substrate and the prism; and
a second polarizing plate arranged between the optical path length modulator and the detector,
wherein a polarization axis of the first polarizing plate and a polarization axis of the second polarizing plate are inclined with respect to a polarization direction of the first polarized light and a polarization direction of the second polarized light.

3. The level sensor of claim 1, wherein the prism comprises at least one of a Nomarski prism, a Wollaston prism, and a Rochon prism.

4. The level sensor of claim 1, wherein the prism is configured such that the first optical path length difference generated by the prism is determined by an incidence height of the reflected light on an incidence surface of the prism, and
the incidence height of the reflected light is a distance between a reference position and an incidence position of the reflected light, on the incidence surface of the prism.

5. The level sensor of claim 4, wherein the prism is configured such that the first optical path length difference generated by the prism has a value of about 1/1000 times to about 1/15 times the incidence height of the reflected light on the incidence surface of the prism.

6. The level sensor of claim 1, wherein the optical path length modulator comprises at least one of a photo-elastic modulator, an electro-optic modulator, and an acousto-optic modulator.

7. The level sensor of claim 1, wherein the detector is further configured to detect a peak point of a strength of the interference signal and detect the first optical path length difference, based on the detected peak point.

8. The level sensor of claim 1, wherein the detector comprises a single photodiode configured to receive the first polarized light and the second polarized light.

9. The level sensor of claim 1, wherein a sampling cycle of the detector is equal to or less than ¼ of an optical path length change cycle of the optical path length modulator.

10. The level sensor of claim 1, further comprising a slit plate configured to be arranged between the measurement light source and the substrate and comprising at least one slit.

11. The level sensor of claim 10, wherein the at least one slit of the slit plate has a width of about 10 μm to about 200 μm.

12. The level sensor of claim 10, wherein the slit plate comprises a plurality of slits.

13. A level sensor configured to detect a height level of a substrate, the level sensor comprising:
- a measurement light source configured to radiate measurement light toward the substrate;
- a slit plate configured to be arranged between the measurement light source and the substrate and comprising at least one slit;
- a Nomarski prism configured to split reflected light of the measurement light, which is reflected by the substrate, into first polarized light and second polarized light and generate a first optical path length difference between the first polarized light and the second polarized light;
- a photo-elastic modulator configured to keep constant an optical path length of the first polarized light and periodically change an optical path length of the second polarized light;
- a detector configured to receive the first polarized light and the second polarized light, which are output from the photo-elastic modulator, and detect the first optical path length difference, based on an interference signal generated by interference between the first polarized light and the second polarized light;
- a first polarizing plate configured to be arranged between the substrate and the Nomarski prism and configured to polarize the reflected light; and
- a second polarizing plate arranged between the photo-elastic modulator and the detector and configured to polarize the first polarized light and the second polarized light.

14. The level sensor of claim 13, wherein a polarization axis of the first polarizing plate and a polarization axis of the second polarizing plate are parallel to each other.

15. The level sensor of claim 13, wherein the photo-elastic modulator is further configured to change an optical path length difference between the first polarized light and the second polarized light by periodically changing the optical path length of the second polarized light.

16. The level sensor of claim 13, wherein, in the photo-elastic modulator, the optical path length of the second polarized light is modulated in a sinusoidal wave form.

17. The level sensor of claim 13, wherein the detector is further configured to generate a strength profile of the interference signal and detect a peak point of a strength of the interference signal from the strength profile.

18. A level sensor configured to detect a height level of a substrate, the level sensor comprising:
- a measurement light source configured to radiate measurement light toward the substrate;
- a slit plate arranged between the measurement light source and the substrate and comprising at least one slit;
- a prism configured to split reflected light of the measurement light, which is reflected by the substrate, into first polarized light and second polarized light and generate a first optical path length difference between the first polarized light and the second polarized light, wherein the first optical path length difference generated by the prism is determined by an incidence height of the reflected light on an incidence surface of the prism;
- an optical path length modulator configured to keep constant an optical path length of the first polarized light and periodically change an optical path length of the second polarized light; and
- a detector configured to receive the first polarized light and the second polarized light, which are output from the optical path length modulator, and detect the first optical path length difference, based on an interference signal generated by interference between the first polarized light and the second polarized light,
- wherein the detector is further configured to detect a peak point of a strength of the interference signal and detect the first optical path length difference, based on the detected peak point.

19. The level sensor of claim 18, wherein the prism comprises a Nomarski prism, and the optical path length modulator comprises a photo-elastic modulator.

20. The level sensor of claim 18, further comprising:
- a first polarizing plate arranged between the substrate stage and a prism; and
- a second polarizing plate arranged between the optical path length modulator and the detector,
- wherein a polarization axis of the first polarizing plate and a polarization axis of the second polarizing plate are parallel to each other, and
- the polarization axis of the first polarizing plate and the polarization axis of the second polarizing plate are inclined with respect to a polarization direction of the first polarized light and a polarization direction of the second polarized light.

* * * * *

UNITED STATES PATENT AND TRADEMARK OFFICE
CERTIFICATE OF CORRECTION

Page 1 of 1

PATENT NO. : 12,313,393 B2
APPLICATION NO. : 18/215437
DATED : May 27, 2025
INVENTOR(S) : Sungho Jang et al.

It is certified that error appears in the above-identified patent and that said Letters Patent is hereby corrected as shown below:

In the Claims

Column 18, Line 33 (Claim 20, Line 1), cancel the text beginning with "20. The level sensor" to and ending "the second polarized light." in Column 18, Line 45 (Claim 20, Line 13), and insert the following claim:
--20. The level sensor of claim 18, further comprising: a first polarizing plate arranged between a substrate stage and the prism; and a second polarizing plate arranged between the optical path length modulator and the detector, wherein a polarization axis of the first polarizing plate and a polarization axis of the second polarizing plate are parallel to each other, and the polarization axis of the first polarizing plate and the polarization axis of the second polarizing plate are inclined with respect to a polarization direction of the first polarized light and a polarization direction of the second polarized light.--

Signed and Sealed this
Eighth Day of July, 2025

Coke Morgan Stewart
*Acting Director of the United States Patent and Trademark Office*